(12) United States Patent
Koyama

(10) Patent No.: US 11,503,392 B2
(45) Date of Patent: Nov. 15, 2022

(54) ULTRASONIC SENSOR

(71) Applicant: DENSO CORPORATION, Kariya (JP)

(72) Inventor: Yu Koyama, Kariya (JP)

(73) Assignee: DENSO CORPORATION, Kariya (JP)

(*) Notice: Subject to any disclaimer, the term of this patent is extended or adjusted under 35 U.S.C. 154(b) by 377 days.

(21) Appl. No.: 16/861,832

(22) Filed: Apr. 29, 2020

(65) Prior Publication Data

US 2020/0260170 A1 Aug. 13, 2020

Related U.S. Application Data

(63) Continuation of application No. PCT/JP2018/039896, filed on Oct. 26, 2018.

(30) Foreign Application Priority Data

Nov. 2, 2017 (JP) .............................. JP2017-212695

(51) Int. Cl.
*G01N 29/34* (2006.01)
*G01S 7/521* (2006.01)
*H01L 41/053* (2006.01)
*H01L 41/09* (2006.01)
*H04R 17/02* (2006.01)
*H04R 1/08* (2006.01)

(52) U.S. Cl.
CPC ............. *H04R 1/08* (2013.01); *G01N 29/34* (2013.01); *G01S 7/521* (2013.01); *H01L 41/0533* (2013.01); *H01L 41/09* (2013.01); *H04R 17/02* (2013.01)

(58) Field of Classification Search
CPC . H01L 41/09; H01L 41/0533; H01L 41/0805; H04R 1/08; H04R 17/02; H04R 3/00; G01N 29/34; G01N 2291/045; G01N 29/2437; G01N 29/32; G01N 2291/101; G01N 2291/011; G01S 7/521
USPC .................................................... 73/632
See application file for complete search history.

(56) References Cited

U.S. PATENT DOCUMENTS

| | | | |
|---|---|---|---|
| 6,051,010 A * | 4/2000 | DiMatteo | A61B 17/22012 606/169 |
| 6,178,249 B1 * | 1/2001 | Hietanen | H04R 19/005 381/174 |
| 6,374,676 B1 | 4/2002 | Arnold et al. | |
| 7,166,910 B2 * | 1/2007 | Minervini | H04R 31/006 381/361 |
| 10,416,306 B2 * | 9/2019 | Estevez | G01S 7/539 |
| 2016/0245914 A1 | 8/2016 | Nomura et al. | |
| 2018/0152774 A1 | 5/2018 | Dong et al. | |
| 2020/0256968 A1 * | 8/2020 | Koyama | G10K 9/122 |
| 2022/0191623 A1 * | 6/2022 | Kobayashi | H04R 17/025 |

FOREIGN PATENT DOCUMENTS

| | | |
|---|---|---|
| CN | 1425916 A | 6/2003 |
| JP | 2002-204498 A | 7/2002 |
| JP | 2009-027284 A | 2/2009 |
| JP | 2009-152723 A | 7/2009 |
| WO | 2014/097479 A1 | 1/2017 |

* cited by examiner

*Primary Examiner* — Jacques M Saint Surin
(74) *Attorney, Agent, or Firm* — Maschoff Brennan

(57) ABSTRACT

In an ultrasonic sensor that is attached to a body component, a negative electrode line connected to a negative terminal is isolated from a shielding portion. The shielding portion is connected to a ground potential point without being connected to the negative electrode line.

9 Claims, 6 Drawing Sheets

ULTRASONIC SENSOR

CROSS REFERENCE TO RELATED APPLICATIONS

This application is based on and incorporates herein by reference Japanese Patent Application No. 2017-212695 filed on Nov. 2, 2017.

BACKGROUND

Technical Field

The present disclosure relates to an ultrasonic sensor that includes a microphone which performs ultrasonic vibration and is configured with a piezoelectric vibration element.

Related Art

A known ultrasonic sensor is attached to a body component such as a bumper of a vehicle, generates ultrasonic waves from the microphone, and receives reflected waves of the ultrasonic waves, for detecting an obstacle that is near the vehicle. With such an ultrasonic sensor, it is necessary to ensure resistance to noise (hereinafter referred to as EMC) and resistance to electrostatic discharge (hereinafter referred to as ESD). For this reason, in order to improve the shielding effect of the microphone case in which the microphone is built, the microphone case is formed of an electrical conductor and is grounded by being connected to a ground (hereinafter, referred to as GND) potential point.

DESCRIPTION OF SPECIFIC EMBODIMENTS

Figure 1:
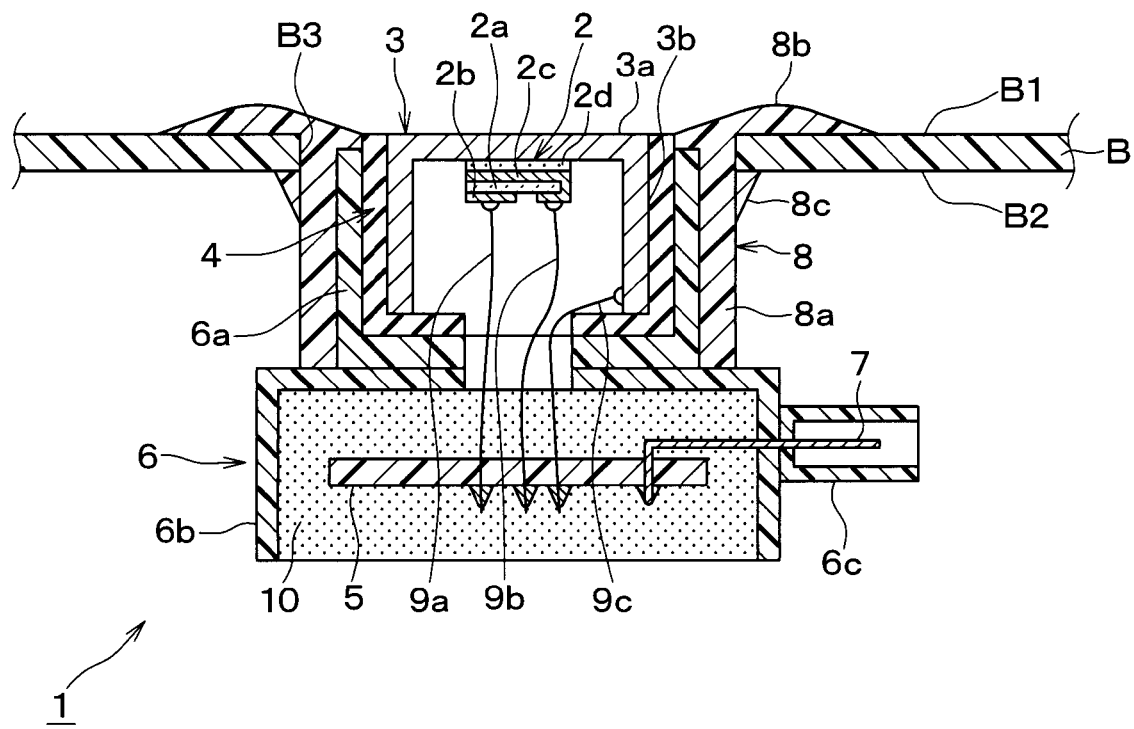
FIG. 1 is a cross-sectional view of an ultrasonic sensor according to a first embodiment.

The known ultrasonic sensor, as disclosed in U.S. Pat. No. 6,374,676, has a configuration in which a microphone formed of a piezoelectric vibration element is housed in a cylindrical microphone case that is shaped with a bottom and is made of an electrical conductor, with the microphone attached at the bottom of the microphone case. A positive terminal is provided on the surface of the microphone that is on the opposite side from the bottom of the microphone case, and a negative terminal is provided on the surface of the microphone that faces the microphone case, with the negative terminal being electrically connected to the microphone case. In addition, a positive wiring lead is connected to the positive terminal of the microphone and a negative wiring lead is connected to the negative terminal. By electrically connecting the negative terminal and the microphone case, the microphone case becomes electrically connected to the negative wiring lead through the negative terminal and hence is connected to GND. In the following description, the configuration of the ultrasonic sensor described in U.S. Pat. No. 6,374,676 is referred to as conventional configuration 1.

There is also another configuration in which the microphone is attached to the bottom of the microphone case, and in which the positive wiring lead is connected to the positive terminal of the microphone, while the negative wiring lead is connected to the microphone case. In this case, the negative terminal of the microphone is connected to GND through the microphone case. In the following description, the configuration of an ultrasonic sensor in which the negative terminal is connected to GND through the microphone case is referred to as conventional configuration 2.

It is preferable for the transmitting/receiving circuit of the ultrasonic sensor to have a symmetrical circuit configuration with respect to the positive electrode side and the negative electrode side, centered on the microphone. With such a configuration, for example, when common mode noise is transmitted both to the positive electrode side circuit and to the negative electrode side circuit, and is added, for example when the entire ultrasonic sensor vibrates, the noise signal has the same phase in the positive electrode side circuit and in the negative electrode side circuit. Hence when the signal is differentially amplified by the amplifier provided in the transmitting/receiving circuit, the noise signal is canceled, and the influence of the noise can thereby be suppressed.

However, in the conventional configuration 1 and the conventional configuration 2 described above, the circuit configuration is not symmetrical between the positive electrode side and the negative electrode side, in the parts which connect the negative terminal and the microphone case to GND, and hence noise cancellation is not achieved when the amplifier effects differential amplification. Thus, there is an issue that the S/N ratio is reduced due to the effects of noise.

In view of the foregoing, it is desired to have an ultrasonic sensor that is capable of more effectively suppressing the effects of noise.

One aspect of the present disclosure provides an ultrasonic sensor including a microphone having a piezoelectric film with a positive terminal and a negative terminal disposed on respective sides thereof, constituting a piezoelectric vibrating element for converting an electrical signal into vibration and converting a vibration into an electrical signal, a microphone case which houses the microphone and has a vibration portion with the microphone attached thereto, a transmitting circuit for transmitting ultrasonic waves from the vibration portion based on vibration of the microphone, a receiving circuit for differentially amplifying an electrical signal that is produced when a vibration based on reflected waves of the ultrasonic wave is transmitted from the vibration portion to the microphone and is converted into the electrical signal, a positive electrode line that connects the transmitting circuit and the receiving circuit and that is connected to the positive terminal, and a negative electrode line that is connected to the negative terminal, and a shielding portion that is made of an electrical conductor, is electrically isolated from the negative electrode line, and provides a shielding effect against noise by surrounding the microphone. With the ultrasonic sensor having such a configuration, the shielding portion is electrically connected to a ground potential point that is electrically isolated from the negative electrode line.

The negative electrode line to which the negative terminal is connected is thus isolated from GND, so that the microphone case is connected to GND without being connected to the negative electrode line. With such a configuration it is possible to suppress the effects of noise, including common mode noise, and prevent a decrease in EMC resistance and ESD resistance.

Embodiments of the present disclosure will be described in the following referring to the drawings. In each of the following embodiments, components that are the same or equivalent in respective embodiments are described using identical reference labels.

First Embodiment

The configuration of an ultrasonic sensor 1 according to a first embodiment will be described referring to FIG. 1. As shown in FIG. 1, the ultrasonic sensor 1 according to the present embodiment is installed on a vehicle by being mounted on a bumper B, which is a plate-shaped part of the vehicle body. The bumper B has a bumper outer surface B1 that forms the outer surface of the vehicle and has, at the rear, a bumper inner surface B2. A mounting hole B3, which is a through hole, is formed in the bumper B, for mounting the ultrasonic sensor 1.

The ultrasonic sensor 1 includes a microphone 2, a microphone case 3, a cushion 4, a circuit board 5, a sensor case 6, a sensor connector 7, etc., and is mounted on the bumper B via a mounting component 8.

In the ultrasonic sensor 1, the microphone 2 is configured by a piezoelectric vibrating element and constitutes an ultrasonic transducer that serves as a sound collecting unit or as a sound emitting unit 1 by converting an electrical signal into vibration or converting vibration into an electrical signal. The microphone 2 includes a piezoelectric film 2a such as lead zirconate titanate (hereinafter, referred to as PZT), a positive terminal 2b connected to one side of the piezoelectric film 2a, and a negative terminal 2c connected to the other side of the piezoelectric film 2a, with the side having the negative terminal 2c being attached to the microphone case 3.

Specifically, the side of the microphone 2 on which the positive terminal 2b is disposed is opposite the side that is attached to the microphone case 3. Furthermore, although the negative terminal 2c is formed on the other side of the piezoelectric film 2a from that of the positive terminal 2b, it is formed with a folded configuration such as to reach to the side of the piezoelectric film 2a on which the positive terminal 2b is disposed. Hence, the negative terminal 2c is configured on the same side as the positive terminal 2b while being insulated and separated from the positive terminal 2b. Thus, the electrical connections to the microphone 2 can be made on one side of the microphone, although the negative terminal 2c is attached to the microphone case 3 on the other side of the microphone 2. The positive terminal 2b is electrically connected via a positive wiring lead 9a to a positive electrode pattern (not shown) provided on the circuit board 5, and the negative terminal 2c is electrically connected via a negative wiring lead 9b to a negative electrode pattern (not shown) provided on the circuit board 5.

With such a configuration, the microphone 2 can be vibrated by applying thereto a voltage serving as a drive signal, that is to say by applying a rectangular-wave voltage to the positive terminal 2b, causing a potential difference to be repeatedly generated between the positive terminal 2b and the negative terminal 2c. Furthermore, when it is displaced by external vibration, the microphone 2 generates a corresponding electromotive force as output. The application of the drive signal to the microphone 2 and the outputting of the electromotive force from the microphone 2 are performed via the positive wiring lead 9a and the negative wiring lead 9b which connect the microphone 2 and the circuit board 5.

In the present embodiment, the microphone 2 is attached to the microphone case 3 by an insulating bonding agent 2d, such as an insulating adhesive. The negative terminal 2c of the microphone 2 is thereby insulated from the microphone case 3.

The microphone case 3 serves to output vibration that is generated by the microphone 2 to the exterior, as ultrasonic waves, or to transmit vibration from the exterior to the microphone 2, and in the present embodiment the microphone case 3 also functions as a shield against noise. The microphone case 3 consists of a bottomed cylindrical member having a bottom portion 3a and a side wall portion 3b, with the interior of the microphone case 3 serving as a containing space having the microphone 2 housed therein, attached to the center of the bottom portion 3a. The microphone case 3 is arranged with the bottom portion 3a side facing the bumper outer side B1 and with the side wall 3b side, in other words the opening side of the microphone case 3, facing the bumper inner side B2.

The microphone case 3, configured as described above, transmits ultrasonic waves with the bottom portion 3a serving as a vibration portion. Specifically, when the microphone 2 is vibrated by applying thereto a voltage serving as a drive signal, the bottom portion 3a is also vibrated accordingly. Based on such operation, the bottom portion 3a of the microphone case 3 is vibrated ultrasonically, transmitting ultrasonic waves.

When reflected waves of the transmitted ultrasonic waves return, the microphone case 3 causes the bottom portion 3a to vibrate accordingly, thereby transmitting the vibration to the microphone 2 that is attached to the bottom portion 3a. As a result, an electromotive force corresponding to the transmitted vibration is generated as output from the microphone 2, and based on this electromotive force the ultrasonic sensor 1 can detect reception of the reflected waves.

In the case of the present embodiment, the microphone case 3 is formed of an electrical conductor. Aluminum, a conductive polymer, or a material obtained by solidifying a metal filler with a resin may for example be used as the conductor material. The microphone case 3 is electrically connected via a GND wiring lead 9c to a GND pattern (not shown) which is a region that is at GND potential point on the circuit board 5.

As described above the negative terminal 2c of the microphone 2 is insulated from the microphone case 3, since the microphone 2 is attached to the microphone case 3 via an insulating bonding agent 2d. The negative terminal 2c and the microphone case 3 are thus electrically connected to the negative pattern and the GND pattern of the circuit board 5 via respectively different wiring leads, i.e., the negative wiring lead 9b and the GND wiring lead 9c, respectively.

Although not shown here, the interior of the microphone case 3 is filled with a vibration-proof material such as silicone rubber.

The cushion 4 has a cylindrical portion formed with a hollow portion into which the microphone case 3 is fitted. In the present embodiment, the cushion 4 has a bottomed cylindrical shape. The microphone case 3 is accommodated in the hollow portion of the cushion 4 together with the microphone 2, etc. The cushion 4 serves as a buffer member made of an elastic material, and suppresses transmission of vibration between the microphone case 3 and the bumper B or the sensor case 6. The cushion 4 is made of an insulating elastic material such as silicone rubber.

The circuit board 5 is provided with respective components that constitute the sensor circuit of the ultrasonic sensor 1. The sensor circuit, shown in FIG. 2, consists of the microphone 2 and the microphone case 3 connected by the wiring leads 9a to 9c to the circuit board 5, together with various electronic components that are mounted on the circuit board 5 and are not shown in FIG. 1.

Figure 2:
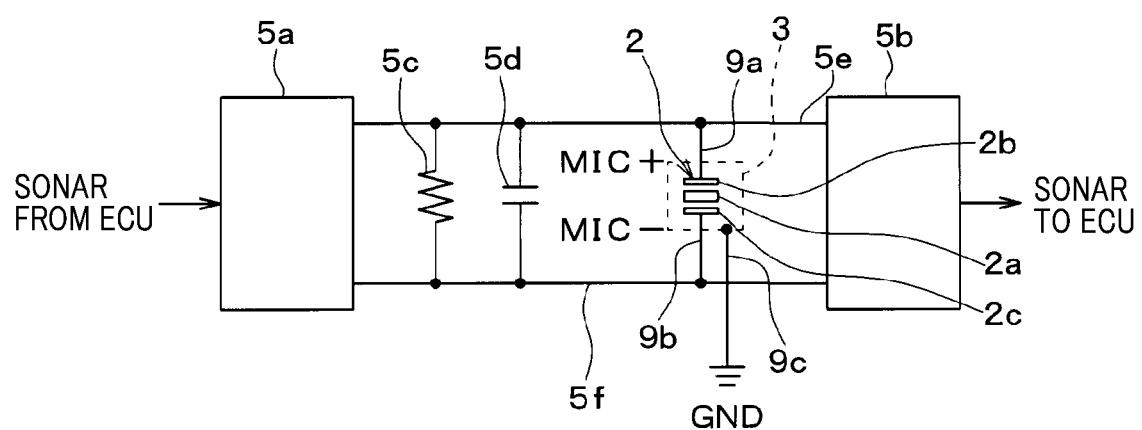
FIG. 2 is a circuit diagram of the ultrasonic sensor shown in FIG. 1.

Specifically, as shown in FIG. 2, the sensor circuit is configured of a transmitting circuit 5a, a receiving circuit 5b, a resistor 5c, a capacitor 5d, etc., in addition to the microphone 2. Various components constituting the transmitting circuit 5a and the receiving circuit 5b, and various electronic components such as the resistor 5c and the capacitor 5d, are mounted on the circuit board 5.

The transmitting circuit 5a is configured by a booster circuit that includes a booster coil, and that boosts a voltage applied from outside the ultrasonic sensor 1 and applies the boosted voltage to the microphone 2. The microphone 2 and the bottom portion 3a of the microphone case 3 are thereby vibrated, transmitting ultrasonic waves. The receiving circuit 5b is configured by an amplifier, etc., which, during reception, performs differential amplification and converts the vibration transmitted to the microphone 2 through the microphone case into an electrical signal. The transmitting circuit 5a and the receiving circuit 5b are connected by a positive electrode line 5e and a negative electrode line 5f. The resistor 5c and the capacitor 5d are connected between the positive electrode line 5e and the negative electrode line 5f, and the microphone 2 is also connected between the positive electrode line 5e and negative electrode line 5f.

The LCR circuit including the resistor 5c and the capacitor 5d and the booster coil incorporated in the transmitting circuit 5a exhibit a series resonance, while the LCR circuit and the capacitance C of the microphone 2 exhibit a parallel resonance, and these are designed to obtain resonance matching. In addition, the microphone case 3, indicated in broken-line form in the figure, is connected such as to be at GND potential, by being connected to GND via the GND wiring lead 9c while being electrically separated from the negative electrode line 5f to which the negative terminal 2c is connected.

Various wiring patterns are formed on the circuit board 5, to obtain such a circuit configuration. That is, a positive electrode pattern forming the positive electrode line 5e, a negative electrode pattern forming the negative electrode line 5f, and a GND pattern functioning as a GND potential point connected to the GND wiring lead 9c, are respectively formed. The circuit shown in FIG. 2 is configured by connecting the positive wiring lead 9a to the positive electrode pattern, connecting the negative wiring lead 9b to the negative electrode pattern, and connecting the GND wiring lead 9c to the GND pattern. Although not shown in FIGS. 1 and 2, a CPU (not shown) for executing signal processing, and an interface (hereinafter referred to as an I/F), etc., that transmits and receives signals to/from the exterior are also implemented on the circuit board 5.

The sensor case 6 is a hollow member that forms the casing of the ultrasonic sensor 1, and is integrally formed of a hard insulating synthetic resin such as polybutylene terephthalate.

Specifically, the sensor case 6 is configured to include a cylindrical portion 6a, a substantially rectangular housing portion 6b, and a connector case 6c. The hollow portion of the cylindrical portion 6a and the housing portion 6b are connected to one other, and the microphone case 3 and the cushion 4 to which the microphone 2 is attached are fixed in the cylindrical portion 6a, while the wiring leads 9a to 9c are led out at the housing portion 6b side. The circuit board 5 is disposed in the hollow part of the housing portion 6b, with one end of the sensor connector 7 protruding outward. The circuit board 5 is electrically connected to the various wiring leads 9a to 9c inside the housing portion 6b, and is also electrically connected to one end of the sensor connector 7. In addition, one side of the housing portion 6b facing the cylindrical portion 6a is open, and a moisture-proof member 10 is disposed such as to fill the hollow part of the housing portion 6b from the opening portion.

The connector case 6c is provided at one end of the sensor case 6, with the other end of the sensor connector 7 exposed from the connector case 6c.

The sensor connector 7 serves to establish electrical connections between the ultrasonic sensor 1 and the exterior. Although only one line is shown in the figure, a plurality are provided, such as lines for voltage application purposes, GND connection purposes, outputting, etc. One end of the sensor connector 7 is led into the housing portion 6b of the sensor case 6 and connected to the circuit board 5, while the other end is exposed from the connector case 6c. An electrical connection can thereby be made between the ultrasonic sensor 1 and the exterior, by connecting terminals provided in an external connector (not shown) to the end of the sensor connector 7 that is exposed from the connector case 6c.

The mounting component 8 is a component made of resin or the like, which constitutes a retainer for firmly attaching the ultrasonic sensor 1 to the bumper B, and also is a bezel with a design exposed on the outer side B1 of the bumper. In the present embodiment, the mounting component 8 is configured to include a cylindrical portion 8a, a flange portion 8b, and a stopper portion 8c.

The cylindrical portion 8a is a part into which the cylindrical portion 6a of the sensor case 6, the microphone case 3, etc., are fitted. The ultrasonic sensor 1 is held by the mounting component 8, by fitting the cylindrical portion 6a, the microphone case 3, etc., into the hollow part of the cylindrical portion 8a. The flange portion 8b is disposed at one end of the cylindrical portion 8a, extending radially outward therefrom. One outer side of the flange portion 8b constitutes the bezel with a design exposed on the bumper outer surface B1. The stopper portion 8c is formed on a side surface of the cylindrical portion 8a, positioned apart from the flange portion 8b by a predetermined distance. Since the resin portion of the bumper B is sandwiched between the stopper portion 8c and one of the internal surfaces of the flange portion 8b, the mounting component 8 is firmly attached to the bumper B, thereby mounting the ultrasonic sensor 1 on the bumper B.

Figure 3:
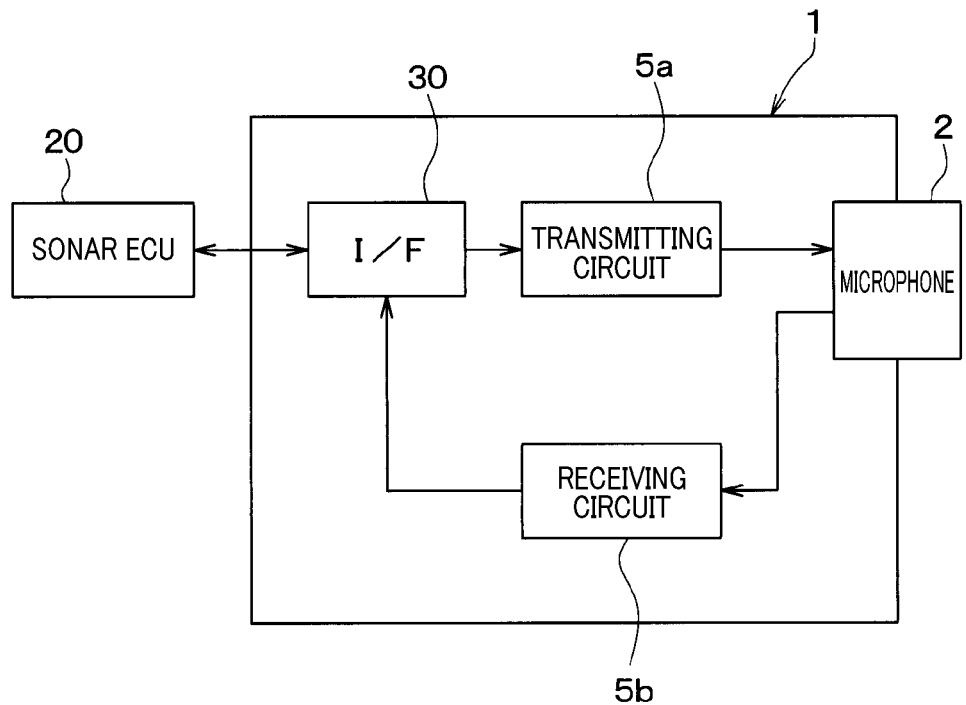
FIG. 3 is a block diagram of an ultrasonic sensor.

The ultrasonic sensor 1 according to the present embodiment is configured, and mounted on the bumper B via the mounting component 8, as described above. With that configuration, expressed in block diagram form in FIG. 3, the ultrasonic sensor 1 includes an I/F 30 that exchanges signals with an external sonar ECU 20, a transmitting circuit 5a, a receiving circuit 5b, and a microphone 2. The ultrasonic sensor 1 performs the following operations.

Firstly, if the ignition switch (not shown) of the vehicle is turned on, and a predetermined object detection condition is satisfied, for example a condition that the vehicle speed is equal to or lower than a predetermined speed, a drive signal is outputted from the sonar ECU 20 and transmitted to the transmitting circuit 5a via the I/F 30. The drive signal is, for example, a rectangular wave signal that is repeated with a predetermined cycle, and is boosted by the booster circuit provided in the transmitting circuit 5a before being applied to the positive terminal 2b of the microphone 2. The microphone 3 and the bottom portion 3a of the microphone case 3 are thereby vibrated, and ultrasonic waves are transmitted.

The transmitted ultrasonic waves are then reflected from an obstacle, etc., that is near the vehicle, and when the reflected wave returns to the ultrasonic sensor 1, the bottom portion 3a is vibrated accordingly, and the vibration is transmitted to the microphone 2 which is attached to the bottom portion 3a. As a result, the microphone 2 generates an electromotive force in accordance with the vibration. This electromotive force is differentially amplified by the receiving circuit 5b, subjected to signal processing by a CPU (not shown) as required, and outputted to the sonar ECU 20 via the I/F 30. The sonar ECU 20 calculates the presence or absence of an obstacle, and the distance to an obstacle, based on the output of the ultrasonic sensor 1.

With such an ultrasonic sensor 1, as described above, the negative terminal 2c of the microphone 2 is connected to the negative electrode line 5f while the microphone case 3 is connected to GND, with the negative terminal 2c and the microphone case 3 being insulated from one another. For that reason, the ultrasonic sensor 1 can further suppress the effects of noise. The reasons for obtaining such an effect will be described together with a comparison to the configuration of a conventional ultrasonic sensor.

Figure 4:
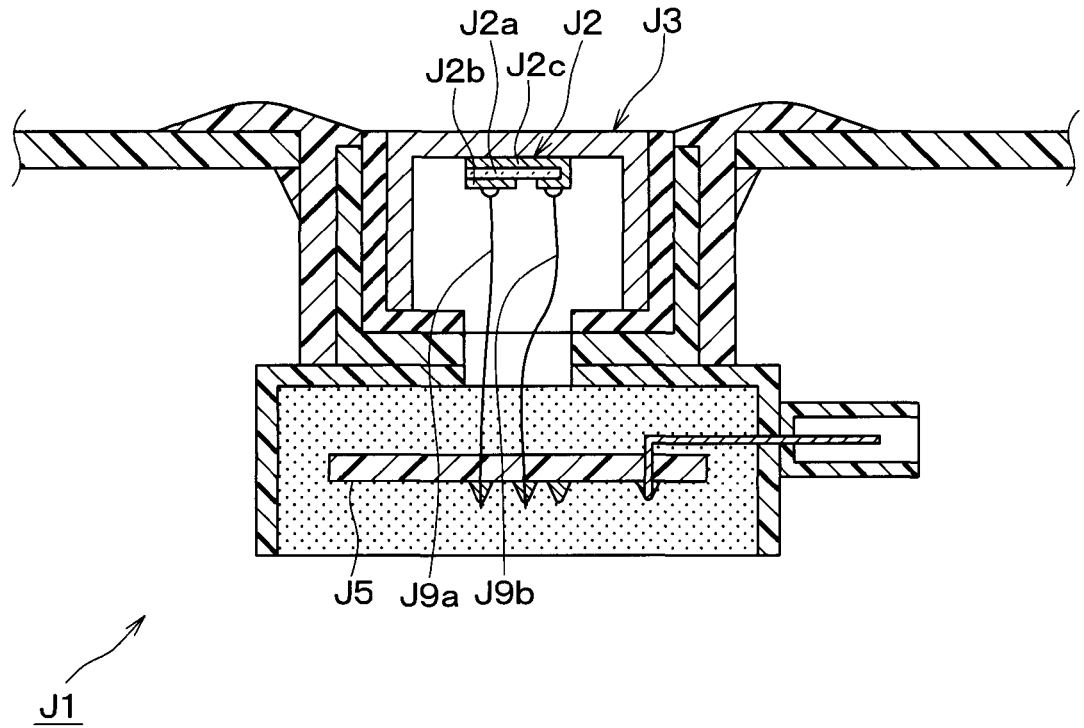
FIG. 4 is a cross-sectional view of an ultrasonic sensor having a conventional configuration 1.

As shown in FIG. 4, the conventional ultrasonic sensor J1 is configured with a microphone J2 attached to a metal microphone case J3. The microphone J2 has a configuration in which a piezoelectric film J2a is interposed between a positive terminal J2b and a negative terminal J2c, with the negative terminal J2c side being attached to the microphone case J3. The negative terminal J2c and the microphone case J3 are electrically connected to one another, by being attached with an electrically conductive adhesive or the like. Furthermore the positive terminal J2b is electrically connected to a circuit board J5 via a positive wiring lead J9a, and the negative terminal J2c is electrically connected to the circuit board J5 via a negative wiring lead J9b. The microphone case J3 is electrically connected to the circuit board J5 via the negative terminal J2c and the negative wiring lead J9b.

Figure 5:
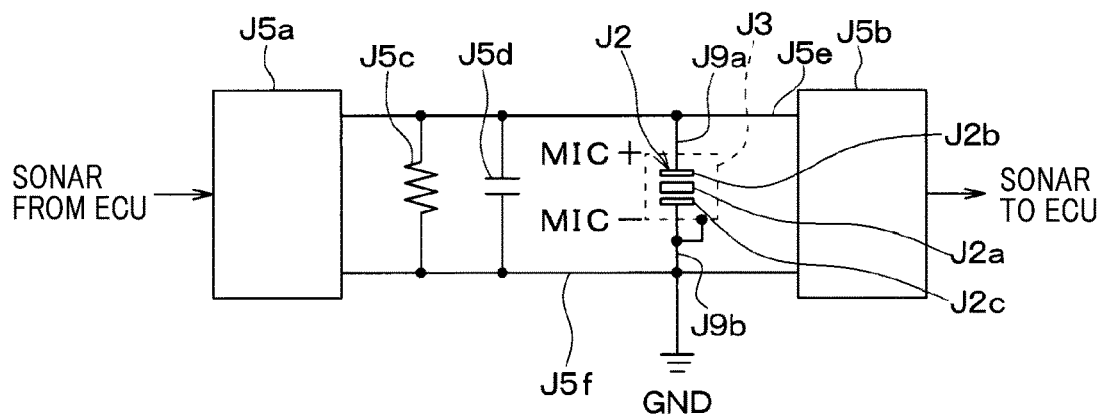
FIG. 5 is a circuit diagram of the ultrasonic sensor shown in FIG. 4.

As shown in FIG. 5, such a sensor circuit has a configuration in which a transmitting circuit J5a and a receiving circuit J5b, together with a resistor J5c and a capacitor J5d, are connected by a positive electrode line J5e and a negative electrode line J5f. The microphone J2 is connected to the positive electrode line 35e and the negative electrode line J5f via the positive electrode line J9a and the negative electrode line J9b respectively, and the microphone case J3 is connected to the negative electrode line J5f as a result of being connected to the negative electrode line J9b.

With such an arrangement, the circuit configuration is not symmetrical between the positive electrode side and the negative electrode side, in the part where the negative terminal J2c and the microphone case J3 are connected to GND, and hence there is a failure to achieve noise cancellation when the amplifier in the receiving circuit J5b performs differential amplification. There is thus an issue that the S/N ratio is reduced due to the effects of noise.

On the other hand with the ultrasonic sensor 1 of the present embodiment as shown in FIG. 2, a configuration is used whereby the negative terminal 2c of the microphone 2 is connected to the negative electrode line 5f through the negative wiring lead 9b, however the microphone case J3 connected to GND through the GND wiring lead 9c. That is, the configuration is such that the negative electrode line 5f, to which the negative terminal 2c is connected via the negative wiring lead 9b, is isolated from GND, and hence the microphone case 3 is connected to GND without being connected to the negative electrode line 5f.

The transmitting circuit 5a and the receiving circuit 5b of the ultrasonic sensor 1 thereby have a symmetrical circuit configuration with respect to the positive electrode side and the negative electrode side, centered on the microphone 2. With such a configuration, for example when common mode noise transmitted to both the positive electrode side circuit and the negative electrode side circuit is added, as for example if the ultrasonic sensor 1 electromagnetically vibrates, then the noise will have the same phase in the positive electrode side circuit and in the negative electrode side circuit. For that reason, when differentially amplified by the amplifier provided in the receiving circuit 5b, the noise signal will be canceled, and hence the effects of the noise can be suppressed. The S/N ratio can thereby be improved.

In addition, since the microphone case 3 is formed overall as an electrical conductor and is connected to GND, the microphone case 3 is made to function as a shielding portion which can provide a shielding effect, thereby enabling EMC resistance and ESD resistance to be obtained.

With an ultrasonic sensor 1 according to the present embodiment as described above, the negative electrode line 5f, to which the negative terminal 2c is connected via the negative wiring lead 9b, is separated from GND, and the microphone case 3 is connected to GND instead of being connected to the negative electrode line 5f. With such a configuration, it is possible to suppress the effects of noise, including common mode noise, while preventing a decrease in EMC resistance and ESD resistance. In addition, the S/N ratio can be improved.

Second Embodiment

A second embodiment will be described.

The configuration etc., of the microphone case 3 in the present embodiment are changed from those of the first embodiment, while the other components are the same as those in the first embodiment. Hence, only those parts which are different from the first embodiment will be described.

In the first embodiment, the entire microphone case 3 is made of an electrical conductor, so that the entire microphone case 3 functions as a shielding portion. However in the present embodiment only a part of the microphone case 3 is made of an electrical conductor, instead of the entire case.

Figure 6:
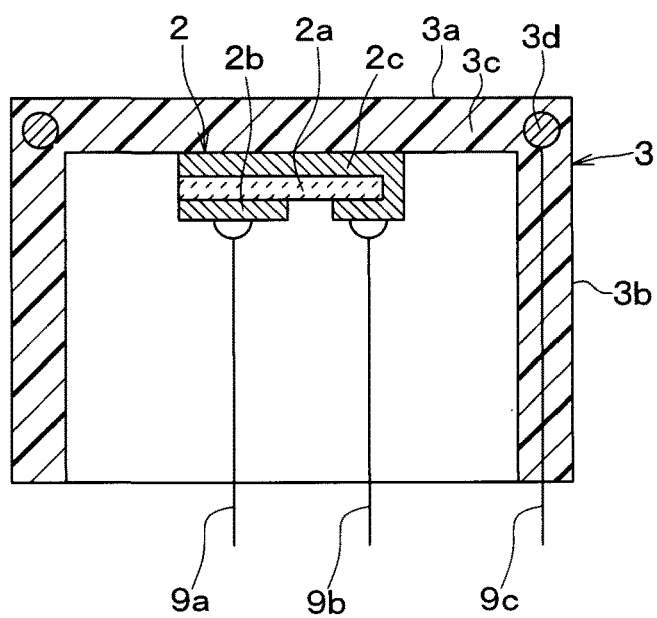
FIG. 6 is a cross-sectional view showing only the vicinity of a microphone and a microphone case provided in an ultrasonic sensor according to a second embodiment.

Specifically, with the present embodiment, as shown in FIG. 6, the microphone case 3 has a case main body portion 3c that forms the outer shape and that is made of an insulator, and shielding portion 3d that is partially made of an electrical conductor and is configured to exhibit a shielding effect.

The case main body portion 3c is made of, for example, a resin, and is formed with a bottomed cylindrical shape having a bottom portion 3a and a side wall portion 3b. The shielding portion 3d is made for example of a metal such as aluminum, formed in an annular shape surrounding the microphone 2, and embedded in the case main body portion 3c. One end of the GND wiring lead 9c is also embedded in the case main body portion 3c, such as to be electrically connected to the shielding portion 3d, while the other end of the GND wiring lead 9c is designed to be connectable to the circuit board 5 by being led out of the case main body portion 3c.

As described above, the microphone case 3 can be constituted by the case main body portion 3c and the shielding portion 3d. With such a configuration also, the same effects as for the first embodiment can be obtained. The microphone case 3 having such a configuration can be manufactured, for example, by insertion-molding the shielding portion 3d when the case main body portion 3c is formed by resin molding or the like. In that case the case main body portion 3c covers the shielding portion 3d, and the microphone 2 and the shielding portion 3d are configured to be separated from one another. Hence even if the negative terminal 2c is attached to the case main body portion 3c by a conductive adhesive or the like, insulation of the negative terminal 2c from the shielding portion 3d is ensured, and the circuit configuration shown in FIG. 2 can be obtained.

Modified Example of the Second Embodiment

In FIG. 6, although the shielding portion 3d is arranged such as to surround the microphone 2, the shielding portion 3d does not overlap the microphone 2 with respect to the thickness direction of the microphone 2. That is, as viewed from the exterior along a direction that is radial with respect to the central axis of the cylindrical microphone case 3, the shielding portion 3d does not cover the microphone 2. However, this is only an example of the configuration of the shielding portion 3d.

Figure 7:
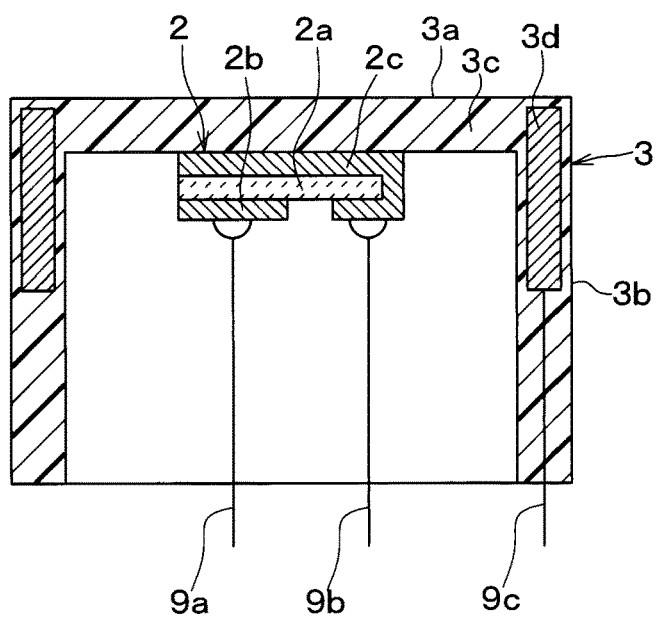
FIG. 7 is a showing the vicinity of a microphone and a microphone case provided in an ultrasonic sensor, for describing a modified example of the second embodiment.

For example, as shown in FIG. 7, a configuration may be adopted in which the shielding portion 3d overlaps the microphone 2 entirely in the thickness direction, in other words, a configuration whereby the shielding portion 3d covers the entire area of the piezoelectric film 2a, the negative terminal 2c and the positive terminal 2b in the stacking direction, as viewed from the exterior of the microphone case 3 in a radial direction. With such a configuration, the shielding effect of the shielding portion 3d can be further enhanced.

Third Embodiment

Figure 8:
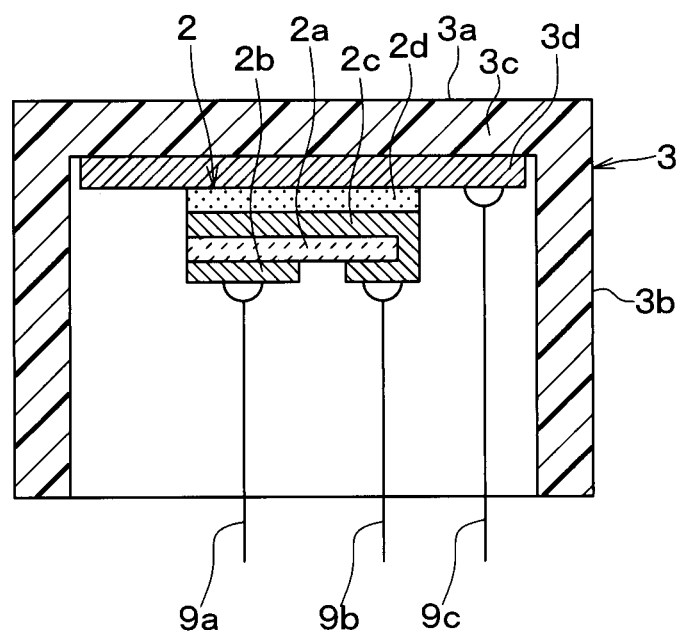
FIG. 8 is a cross-sectional view showing only a microphone and a microphone case provided in an ultrasonic sensor according to a third embodiment.

A third embodiment will be described. This embodiment differs from the second embodiment only with respect to the configuration, etc., of the shielding portion 3d, while the other parts are the same as those of the second embodiment. Hence only those parts which are different from the second embodiment will be described As shown in FIG. 8, in the present embodiment, the shielding portion 3d is formed on the inner wall surface of the bottom portion 3a of the case main body portion 3c, which is cylindrically shaped. The microphone 2 is attached to the shielding portion 3d via an insulating bonding agent 2d, which is made of an insulating adhesive or the like.

In that way, with the microphone case 3 being configured by the case main body portion 3c and the shielding portion 3d, the shielding portion 3d can be formed on the bottom portion 3a of the microphone case 3 such as to cover the entire area of the microphone 2 when viewed from the axial direction of the microphone case 3. With such a configuration also, the same effects as for the first embodiment can be obtained. The microphone case 3 having such a configuration can be manufactured, for example, by attaching or applying the shielding portion 3d to the bottom surface of the case main body portion 3c.

Modified Example of the Third Embodiment

Figure 9:
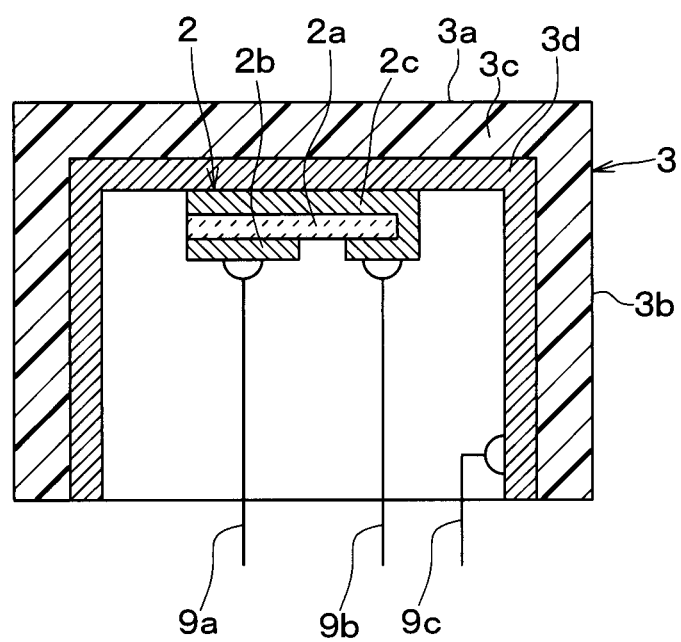
FIG. 9 is a cross-sectional view showing only the vicinity of a microphone and a microphone case provided in an ultrasonic sensor, for describing a modified example of the third embodiment.
Figure 10:
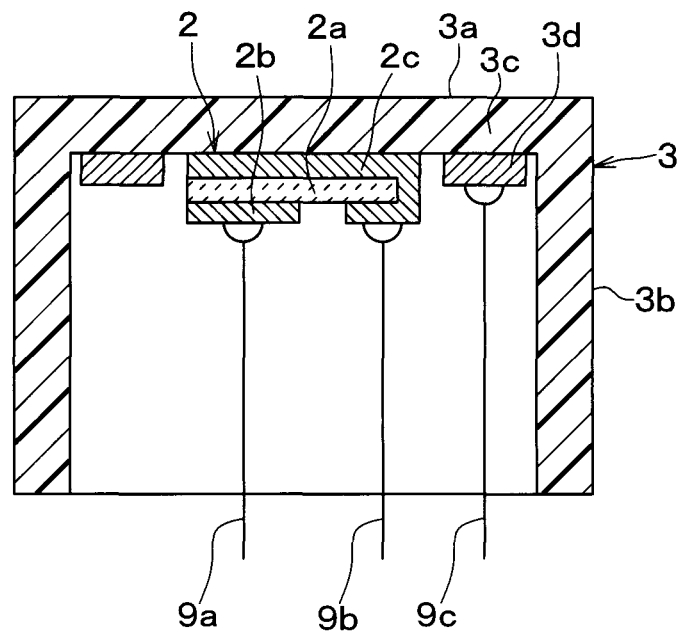
FIG. 10 is a cross-sectional view showing only the vicinity of a microphone and a microphone case provided in an ultrasonic sensor, for describing a modified example of the third embodiment.

In FIG. 8, the shielding portion 3d is formed only on the bottom portion 3a. However, this is only an example of the configuration of the shielding portion 3d. For example, as shown in FIG. 9, a configuration may be used in which the shielding portion 3d is formed on both the bottom portion 3a and the side wall portion 3b, or a configuration (not shown) may be used in which the shielding portion 3d is formed only on the side wall portion 3b. Furthermore, as shown in FIG. 10, a configuration may be used in which a shielding portion 3d is formed on the bottom portion 3a, but in which no shielding portion 3d is formed at the position where the microphone 2 is attached to the case main body portion 3c. Of course, even when the shielding portion 3d is not formed at the position where the microphone 2 is attached, the shielding portion 3d may be formed on the side wall portion 3b.

In these cases, also, the same effects as for the third embodiment can be obtained. When the shielding portion 3d is formed on the side wall portion 3b, the effectiveness of the shielding shield effect can be increased by forming the shielding portion 3d such as to make one turn around the side wall portion 3b. Furthermore, when the shielding portion 3d is formed on both the bottom portion 3a and the side wall portion 3b, the shielding portion 3d can readily be formed by vapor deposition, painting, plating, etc., of metal, thereby reducing manufacturing costs.

Fourth Embodiment

A fourth embodiment will be described. This embodiment also differs from the second embodiment only with respect to the configuration, etc., of the shielding portion 3d, with the other parts being the same as in the second embodiment, and hence only those parts that are different from parts of the second embodiment will be described.

Figure 11:
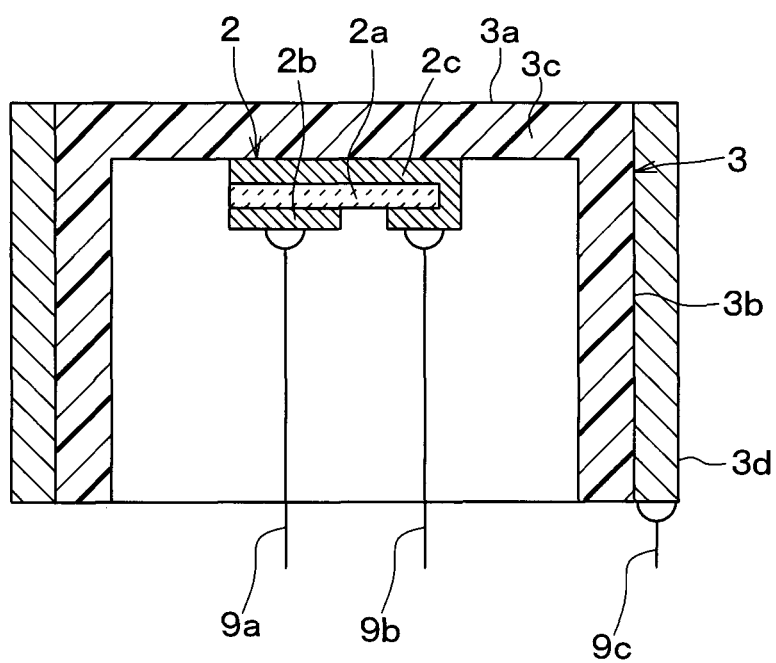
FIG. 11 is a sectional view showing only the vicinity of a microphone and a microphone case provided in an ultrasonic sensor according to a fourth embodiment.

With the present embodiment as shown in FIG. 11, the shielding portion 3d is formed on the outer peripheral surface of the case main body portion 3c, which is cylindrically shaped, such that the shielding portion 3d makes one turn around the outer peripheral surface of the case main body portion 3c, and such as to cover the microphone 2, as viewed from the exterior in a radial direction with respect to the central axis of the microphone case 3.

In that way, with the microphone case 3 being configured by the case main body portion 3c and the shielding portion 3d, the shielding portion 3d can be formed on the outer peripheral surface of the microphone case 3 such as to cover the microphone 2, as viewed from the exterior in the radial direction of the microphone case 3. With such a configuration also, the same effects as for the first embodiment can be obtained. The microphone case 3 having such a configuration can be manufactured, for example, by adhesively attaching or applying the shielding portion 3d to the outer peripheral surface of the case main body portion 3c.

Fifth Embodiment

A fifth embodiment will be described. This embodiment differs from the first embodiment in that a member having a shielding function is provided separately from the microphone case 3, with the other components being the same as those in the first embodiment, and hence only those parts which are different from the second embodiment will be described.

Figure 12:
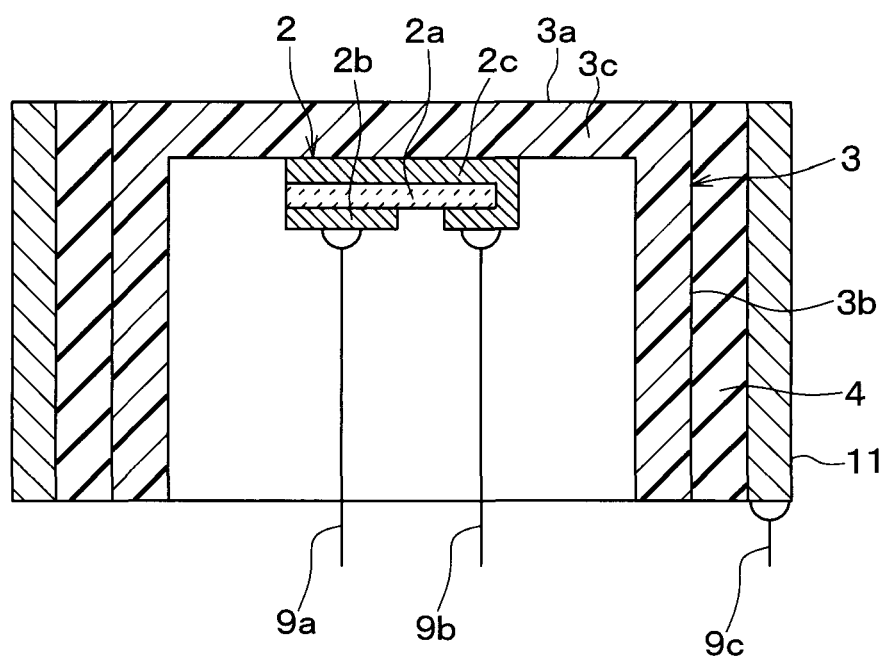
FIG. 12 is a cross-sectional view showing only the vicinity of a microphone and a microphone case provided in an ultrasonic sensor according to a fifth embodiment.

With the present embodiment as shown in FIG. 12, the microphone case 3 is made of a resin, and a shielding portion 11 made of an electrical conductor such as aluminum is provided on the outer peripheral surface of the cushion 4, which is disposed such as to surround the outer periphery of the microphone case 3. The shielding portion 11 has a cylindrical shape, with an inner diameter that is equal to the outer diameter of the cushion 4 and an outer diameter equal to the inner diameter of the cylindrical portion 6a of the sensor case 6, such that the shielding portion 11 fits into the interior of that cylindrical portion 6a together with the microphone case 3 and the cushion 4. The shielding portion 11 is connected to the GND wiring lead 9c, and although not shown, the GND wiring lead 9c is connected to GND by being connected to the circuit board 5.

In that way a configuration may be used in which the shielding portion 11 is provided on the outer peripheral surface of the cushion 4, instead of that of the microphone case 3. With such a configuration also, the same effects can be obtained as for the first embodiment, because of the shield function performed by the shielding portion 11.

Modified Example of the Fifth Embodiment

Although in FIG. 12 the shielding portion 11 is provided on the outer periphery of the cushion 4, it would be equally possible to use a configuration having a shielding portion 11 that is separate from the microphone case 3, and is on the inner peripheral surface of the cushion 4. Furthermore, a configuration may be used in which the shielding portion 11 is buried in the cushion 4.

Other Embodiments

Although the present disclosure has been described based on the above-described embodiments, the scope of the present disclosure is not limited to these embodiments, and includes various modified examples, and modifications that are within an equivalent range. In addition, various combinations and forms, and other combinations and forms including only one element, more or less, are also included in the scope and spirit of the present disclosure.

For example, the configurations of components such as the microphone 2, the microphone case 3, and the sensor case 6 are merely examples, and may be varied as appropriate. In addition, the above embodiments are not mutually irrelevant, and may be appropriately combined, other than when a combination is clearly impossible. For example while the shielding portion may be formed on the bottom portion 3a of the microphone case 3, as for the shielding portion 3d of the second embodiment, it would be equally possible for it to be provided on the outer peripheral surface of the microphone case 3, as for the shielding portion 3d of the fourth embodiment, or on the outer peripheral surface of the cushion 4, as for the shielding portion 11 of the fifth embodiment.

In each of the above embodiments, since the negative terminal 2c of the microphone 2 and the microphone case 3 are not electrically connected, a configuration may be used in which the positive terminal 2b side is attached to the microphone case 3. In that case, the positive terminal 2b can readily be connected to the positive wiring lead 9a by means of a configuration in which the positive terminal 2b is folded round to the surface that is opposite the microphone case 3.

In addition, although the bumper B has been described as an example of the body component on which the ultrasonic sensor 1 is mounted, it would be equally possible for the ultrasonic sensor 1 to be mounted on a body component other than the bumper B, such as a fender panel.

What is claimed is:

1. An ultrasonic sensor that is attached to a body component, comprising:
    a microphone having a piezoelectric film with a positive terminal and a negative terminal disposed on respective sides thereof, constituting a piezoelectric vibrating element for converting an electrical signal into vibration and converting a vibration into an electrical signal;
    a microphone case which houses the microphone and has a vibration portion with the microphone attached thereto;
    a transmitting circuit for transmitting ultrasonic waves from the vibration portion based on vibration of the microphone;
    a receiving circuit for differentially amplifying an electrical signal that is produced when a vibration based on reflected waves of the ultrasonic wave is transmitted from the vibration portion to the microphone and is converted into the electrical signal;
    a positive electrode line that connects the transmitting circuit and the receiving circuit and that is connected to the positive terminal, and a negative electrode line that is connected to the negative terminal; and
    a shielding portion that is made of an electrical conductor, is electrically isolated from the negative electrode line, and provides a shielding effect against noise by surrounding the microphone,
    wherein the shielding portion is electrically connected to a ground potential point that is electrically isolated from the negative electrode line.

2. The ultrasonic sensor according to claim 1, comprising a circuit board provided with the transmitting circuit, the receiving circuit, the positive electrode line and the negative electrode line, and provided with the ground potential point, wherein:
    the positive terminal is connected to the positive electrode line via a positive wiring lead;
    the negative terminal is connected to the negative electrode line via a negative wiring lead; and
    the shielding portion is connected to the ground potential point formed on the circuit board via a ground wiring lead.

3. The ultrasonic sensor according to claim 1, wherein the shielding portion is configured by means of the microphone case being formed of an electrical conductor.

4. The ultrasonic sensor according to claim 1, wherein:
    the microphone case has a case main body portion that is formed of an insulator and includes the vibration portion, and that forms a housing space in which the microphone is housed; and the shielding portion is embedded in the case main body portion.

5. The ultrasonic sensor according to claim 4, wherein the shielding portion surrounds the microphone such as to cover the entire area of the microphone with respect to the thickness direction of the microphone.

6. The ultrasonic sensor according to claim 1, wherein:

the microphone case has a case main body portion that is formed of an insulator and includes the vibration portion, and that forms a housing space in which the microphone is housed; and the shielding portion is formed on an inner wall surface of the case main body portion.

7. The ultrasonic sensor according to claim 6, wherein:

the case main body portion is configured in a bottomed cylindrical shape having a bottom portion and a side wall portion; and the shielding portion is formed on at least one of the bottom portion and the side wall portion.

8. The ultrasonic sensor according to claim 1, wherein:

the microphone case has a case main body portion that is formed of an insulator and includes the vibration portion, and that forms a housing space in which the microphone is housed;

the case main body portion is configured in a bottomed cylindrical shape having a bottom portion and a side wall portion; and the shielding portion is formed on an outer peripheral surface of the side wall portion of the case main body portion.

9. The ultrasonic sensor according to claim 1, wherein the microphone case is configured in a bottomed cylindrical shape having a bottom portion and a side wall portion;

and comprising a buffer member that is made of an elastic material and that has a cylindrical portion configured with a hollow portion into which the microphone case is fitted;

wherein the shielding portion is provided separately from the microphone case, on an outer peripheral surface of the buffer member or on an inner peripheral surface of the buffer member.

* * * * *